United States Patent [19]

Moloney et al.

[11] Patent Number: 5,670,904
[45] Date of Patent: Sep. 23, 1997

[54] PROGRAMMABLE DIGITAL DELAY UNIT

[75] Inventors: David Moloney, Cornaredo; Paolo Gadducci, Pisa, both of Italy

[73] Assignee: SGS-Thomson Microelectronics S.r.l., Agrate Brianza, Italy

[21] Appl. No.: 532,016

[22] Filed: Sep. 21, 1995

[30] Foreign Application Priority Data

Sep. 21, 1994 [EP] European Pat. Off. ............ 94830445

[51] Int. Cl.[6] .................................................... H03H 11/26
[52] U.S. Cl. ........................ 327/277; 327/276; 327/284
[58] Field of Search .......................... 327/261, 269–271, 327/276, 277, 284, 407, 408, 411

[56] References Cited

U.S. PATENT DOCUMENTS

| | | | |
|---|---|---|---|
| 4,820,944 | 4/1989 | Herlein et al. | 327/270 |
| 4,939,677 | 7/1990 | Otuji et al. | 364/569 |
| 5,204,559 | 4/1993 | Deyhimy et al. | 307/480 |
| 5,258,660 | 11/1993 | Nelson et al. | 327/261 |
| 5,389,843 | 2/1995 | McKinney | 327/276 |
| 5,459,422 | 10/1995 | Behrim | 327/276 |

FOREIGN PATENT DOCUMENTS

| | | | |
|---|---|---|---|
| 0 208 049 | 1/1987 | European Pat. Off. | H03K 5/13 |
| 0 361 806 | 4/1990 | European Pat. Off. | G11C 19/00 |
| 0 446 891 A3 | 9/1991 | European Pat. Off. | H04N 1/40 |
| 41 10 340 A1 | 10/1991 | Germany | H03K 17/28 |

OTHER PUBLICATIONS

Bazes, Mel, "A Novel Precision MOS Synchronous Delay Line," *IEEE Journal of Solid–State Circuits* SC–20(6):1265–1271, 1985.

*Primary Examiner*—Toan Tran
*Attorney, Agent, or Firm*—David V. Carlson; Seed and Berry LLP

[57] ABSTRACT

A programmable digital delay unit presenting a number of cascade-connected delay blocks, and a number of controlled bypass elements, one for each delay block. Each bypass element presents a bypass line and a multiplexer for selectively connecting the input or output of the respective delay block to the input of the next delay block. The delay blocks are formed by the cascade connection of flip-flops, and the number of flip-flops in each successive delay block, from the input of the delay unit, decreases in an arithmetic progression to the power of two, so that the selection signals for the respective multiplexers represent the bits of a digital word specifying the required delay.

12 Claims, 3 Drawing Sheets

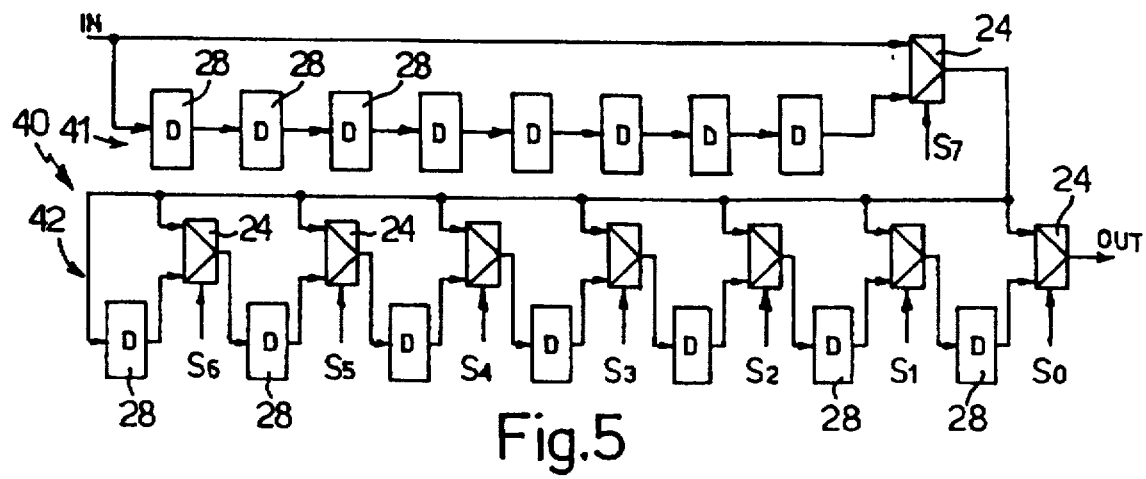
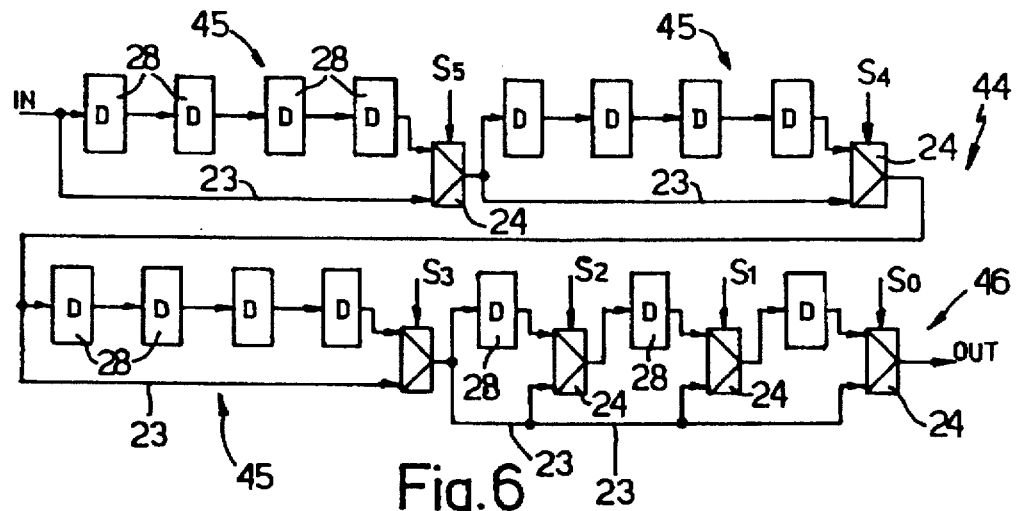
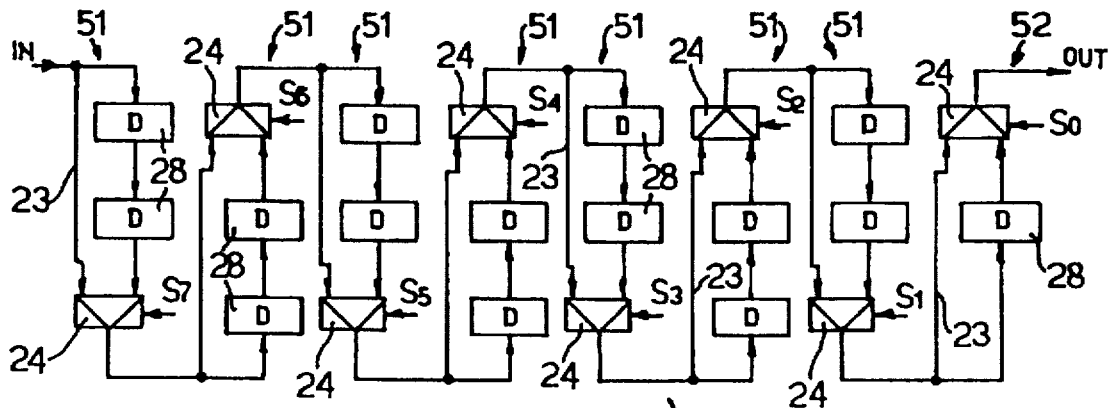

PROGRAMMABLE DIGITAL DELAY UNIT

TECHNICAL FIELD

The present invention relates to a programmable digital delay unit.

BACKGROUND OF THE INVENTION

As is known, a programmable digital delay unit is a unit for delaying digital data (consisting of a number of bits) for a programmable time interval, the value of which is specified by a signal.

A programmable digital delay unit is normally implemented using a RAM memory unit as shown in FIG. 1 wherein the RAM memory is indicated by 1 and presents a write address selection input 2 connected to a counter 3, a read address selection input 4 connected to an adder 5, and a data input/output terminal 6. Counter 3 is supplied with clock pulses CK and in turn supplies a digital signal Z specifying the write address and which is supplied to memory 1 and adder 5. Adder 5 is also supplied with a digital delay control signal M specifying the required delay value, and supplies the memory with a digital signal M+Z specifying the read address. Memory 1 (the specific structure of which is not shown) comprises a memory cell array (with a number of cells equal to the maximum delay selectable); a write address decoder; a read address decoder; and input/output ports.

The above solution presents several drawbacks in that it involves a large number of different elements (memory cells, adders, registers, logic gates); and is limited to low-power circuits by virtue of power consumption being fixed and dependent on clock frequency. Moreover, power consumption of the above known solution is difficult to reduce in that all its components must be kept on at all times for maintaining operation of the delay unit; and the maximum operating frequency of the delay unit is limited by the "fanout" of the memory address and data lines (i.e. by the maximum capacity to drive loads downstream). Specifically, if the selectable delay M ranges between 0 and $2^n-1$ clock strokes and is coded by an n-bit word, the address and data lines are loaded into or drive $2^n$ memory cells. The problem may be partly solved by using a dual-port RAM at the expense of an increase in cost (due to an increase in the area/transistor number ratio) and in power consumption (two address and data buses are required for simultaneously reading and writing of the memory).

Another known implementation of a programmable delay unit comprises an N−1 bit slide register for delaying input data from 0 to N−1, and a multiplexer with N data inputs and an output, as shown schematically in FIG. 2 wherein the slide register is indicated by 10 and is formed by a number of cascade-connected unit delay elements (flip-flops) 11. The output of each delay element 11 is therefore connected to the input of the next delay element and to one of the N inputs 13 of multiplexer 12 which also presents a selection input 14 supplied with the digital selection signal M specifying the required delay, i.e. which delay element 11 output is to be connected to its own output 15.

This solution presents the advantage of permitting a reduction in consumption when the required delay is below maximum, in which case it is possible to disable the last (N−I)−M flip-flops 11 via appropriate logic. Moreover, the fanout of each flip-flop 11 is limited to two, in that each of them only drives the next flip-flop and an input of the multiplexer, so that maximum operating frequency is higher than that of the RAM solution implemented using the same technology.

A disadvantage of the above solution, however, is that multiplexer 12 becomes increasingly difficult to implement alongside an increase in the maximum delay N−1 required, thus limiting its use to low-delay applications.

SUMMARY OF THE INVENTION

It is an object of the present invention to provide a delay unit for achieving high operating frequencies, reduced consumption, a small number of similar components, and troublefree implementation.

According to one aspect of the present invention, a programmable digital delay unit comprising a plurality of sequentially connected delay blocks and a multiplexer for each delay block is provided. Each delay block includes at least one delay element and is capable of delaying a digital input for a selected period of time through the delay elements. A two input multiplexer is associated with each delay block. The input and output of each delay block are connected to the two inputs of the corresponding multiplexer. In response to a selection signal, the multiplexer connects either the input or the output of the corresponding delay block to the input of the next delay block. If the input of the corresponding delay block is connected to the input of the next delay block, this means that the corresponding delay block is being bypassed. According to another aspect of the present invention, means for disabling the bypassed delay block is provided in order to reduce power consumption of the programmable digital delay unit.

A number of preferred, non-limiting embodiments of the present invention will be described by way of example with reference to the accompanying drawings, in which:

BRIEF DESCRIPTION OF THE DRAWINGS

FIGS. 3 to 7 show five different embodiments of the programmable digital delay unit according to the present invention.

DETAILED DESCRIPTION OF THE INVENTION

Figure 3:
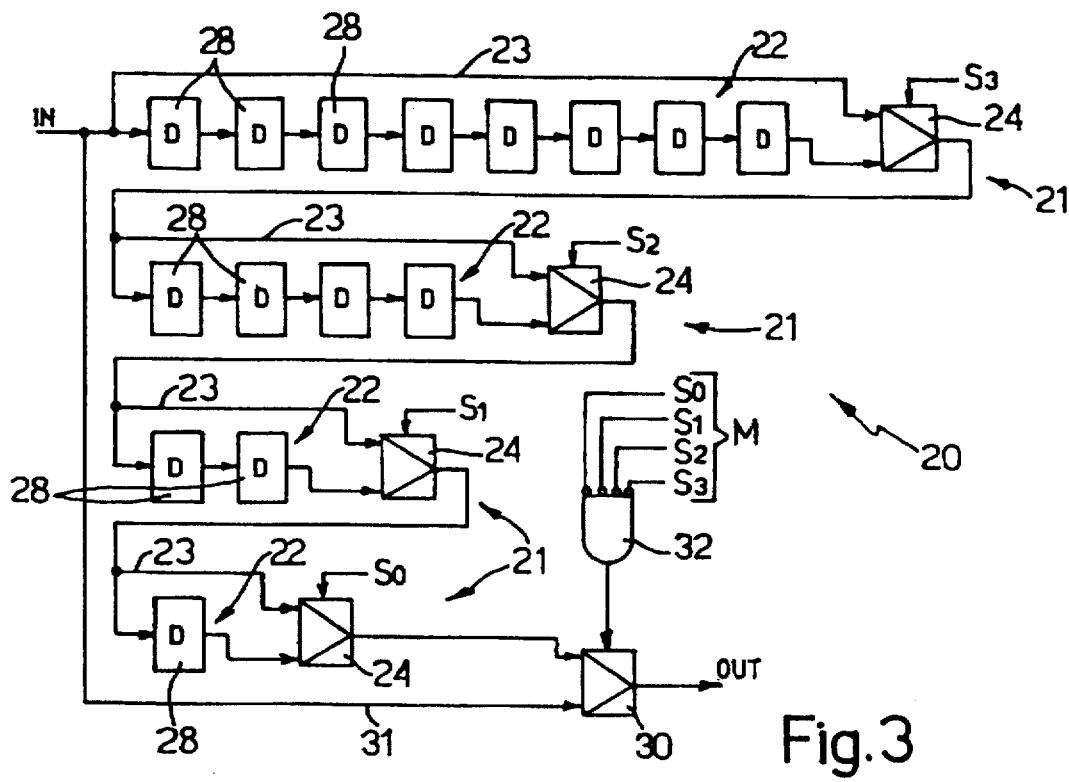

The FIG. 3 delay unit, indicated as a whole by 20, comprises a number of cascade-connected delay sections 21, each of which is formed by a delay block 22, a bypass line 23, and a selector (multiplexer 24) with two data inputs, a selection input and an output. Multiplexer 24 of each delay section 21 is connected at its two data inputs to the output of the respective delay block 22 and to bypass line 23, and is supplied at its selection input with a binary selection signal $S_0-S_3$ specifying which of its two data inputs is to be supplied to the output. The output of multiplexer 24 of the i-th delay section 21 is connected to the input of the (i+1)-th section 21 so as to supply the latter, depending on the value of the selection signal, with the input signal or output (delayed) signal of the i-th delay section.

As shown in FIG. 3, delay blocks 22 comprise a number of cascade-connected unit delay elements, e.g., flip-flops 28. The number of unit delay elements 28 differs in each block, and more specifically decreases to the power of two commencing from the input IN of unit 20, so that, in the example embodiment shown corresponding to a programmable delay of 0 to 15, four delay sections are provided comprising eight, four, two and one unit delay element 28 respectively as of input IN of unit 20. The first delay section therefore supplies a delay switchable from eight clock strokes to zero (8-module delay) depending on the value of the selection signal ($S_3$); the second delay section supplies a delay switchable from four to zero (4-module delay) depending on the value of selection signal $S_2$; the third delay section supplies a delay switchable from two to zero (2-module) depending on the value of $S_1$; and the fourth (last) delay section supplies a delay switchable from one to zero (1-module) depending on the value of $S_0$. Therefore, by adding the delays supplied by each section on the basis of the binary values of $S_3$–$S_0$, it is possible to obtain a delay ranging between 0 and 15.

In view of the unit delay element sequence in the successive delay sections, selection signals $S_0$–$S_3$ present a binary value equal to the corresponding bits of a four-bit digital delay signal; and as in electronic devices the programmable delay required of unit 20 is in fact specified by means of a digital word of this type, delay unit 20 requires no decoding, and the value of the individual bits constituting delay control signal M may be supplied directly to the specific multiplexers.

In the FIG. 3 embodiment, unit 20 also comprises a further multiplexer 30 of the same type as 24, i.e. with two data inputs, a selection input and an output. The multiplexer 30 presents one data input connected to the input IN of unit 20 over a general bypass line 31, the other data input connected to the output of the last (fourth) delay section 21, and the selection input connected to the output of a four-input AND gate 32 supplied with the inverse of selection signals $S_0$–$S_3$. The output OUT of multiplexer 30 also constitutes the output of unit 20 so that, when no delay is required and selection signals $S_0$–$S_3$ all present a low logic value, input signal IN may be supplied directly to the output via general bypass line 31 and multiplexer 30, without going through multiplexers 24 of all the delay sections 21, thus eliminating any possibility of undesired delays.

The minimum configuration of unit 20, i.e. without multiplexer 30 and AND gate 32, comprises fifteen unit delay elements (flip-flops) 28 and four multiplexers 24. In general, a delay unit for supplying a programmable delay of 0 to $2^n-1$ specified by an n-bit digital signal requires $2^n-1$ flip-flops and n multiplexers. Since, as stated, the structure requires no decoding of the delay control signal, it can be implemented with a small number of only two types of components (flip-flops and multiplexers), or three types in the case of the complete solution shown in FIG. 3. In view of the simple nature of the individual components involved, unit 20 is therefore easily implementable in a very small area, particularly for VLSI applications.

Another important advantage of the structure described is that it presents a maximum fanout of 2, in that each multiplexer drives only two components (the first flip-flop and the multiplexer of the next delay section) and each flip-flop drives only one component, thus permitting the use of extremely high operating frequencies.

If a reduction in power consumption is required for delays below the maximum programmable value, the FIG. 3 structure may be further improved by providing the possibility of turning off the flip-flops of individual delay blocks 22 when bypassed by respective line 23.

Figure 4:
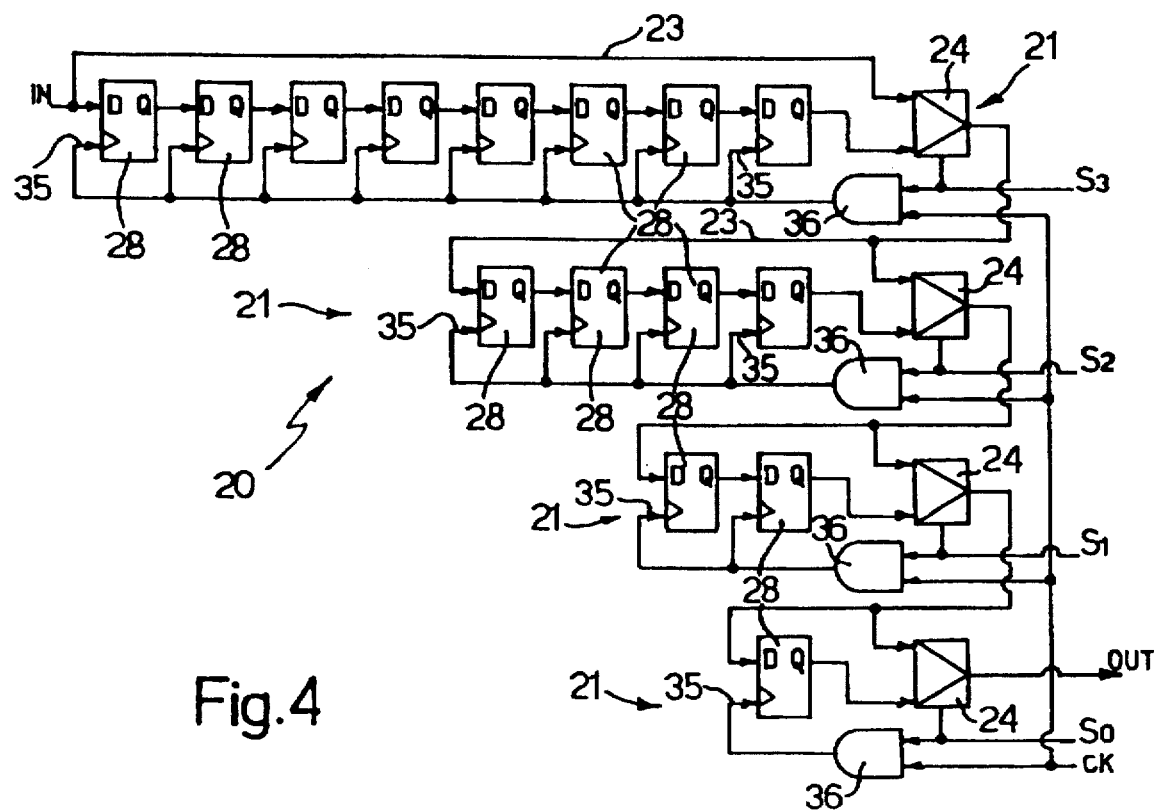

Such a solution is shown in FIG. 4 which is similar to FIG. 3 and in which components 30–32 are omitted and unit delay elements 28 are shown in more detail in the form of D type flip-flops with a clock input 35. As shown in FIG. 4, in which the components are indicated using the same numbering system as in FIG. 3, the clock inputs 35 of flip-flops 28 of each delay section 21 are connected to one another and to the output of a respective two-input AND gate 36 supplied with the respective selection bit $S_0$–$S_3$ and with clock signal CK.

As such, when selection signal $S_i$ of a specific delay section 21 presents a low logic value, by connecting the respective bypass line 23 to its output and disconnecting the output of the respective delay block, the respective AND gate 36 prevents the clock strokes from reaching the flip-flops of the delay block and in practice disables them, thus reducing consumption, on average, by half at the expense of a slight increase in complexity and area for the addition of n AND gates.

FIGS. 5 to 7 show further, hybrid, embodiments of the invention, wherein the potential afforded by delay blocks in decreasing numbers, as in FIGS. 3 and 4, is not exploited fully.

Figure 1:
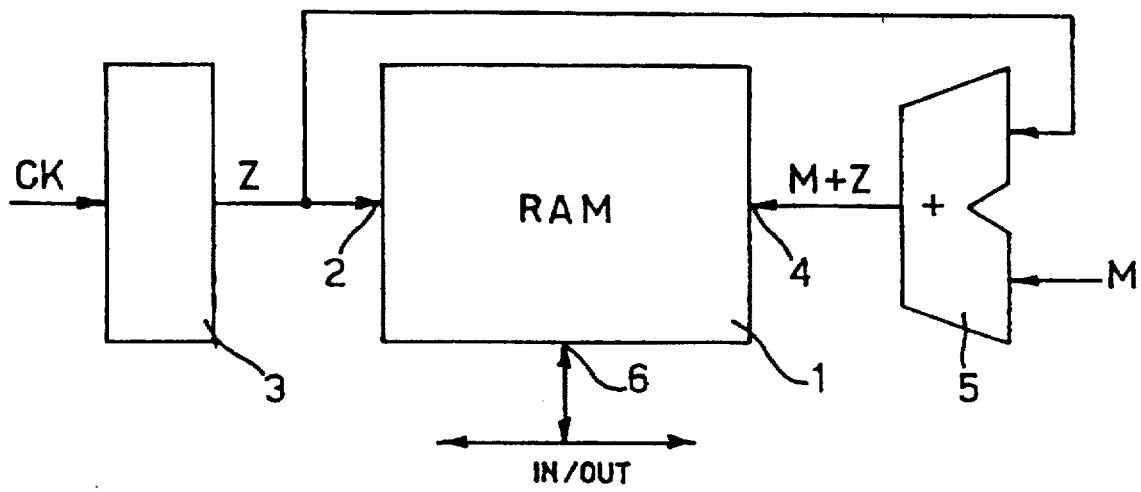
FIGS. 1 and 2 show two different known delay units according to the prior art.
Figure 2:
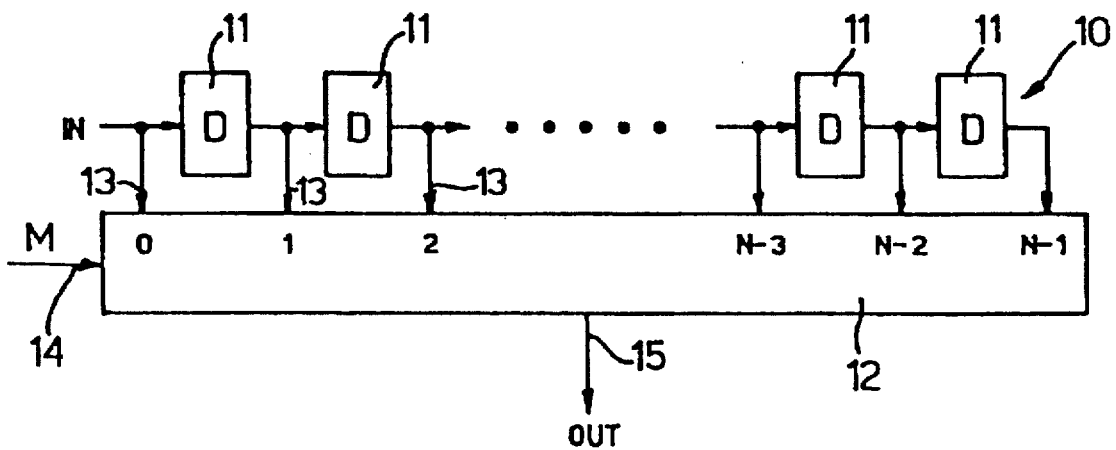

More specifically, FIG. 5 shows a delay unit 40 comprising an 8-module delay section 41 (i.e. with a delay block formed by the cascade connection of eight unit delay elements 28) followed by a delay section 42 programmable from 0 to 7. Programmable delay section 42 comprises seven delay elements 28 and seven multiplexers 24, each multiplexer 24 presenting two data inputs connected respectively to the output of a preceding unit delay element 28 and to the output of the multiplexer 24 of section 41, and an output connected to the input of the next unit delay element 28. Multiplexers 24 of sections 41, 42 receive selection signals $S_0$–$S_7$ which no longer correspond to the bits of a digital delay control signal, as in the case of signal M in FIGS. 1–3, so that decoding logic (not shown) is required at least as regards signals $S_0$–$S_6$ (signal $S_7$ corresponds to the most significant bit of digital delay control signal M).

This solution presents a maximum fanout of 8 (the number of loads driven by the output multiplexer 24 of section 40) and requires 8 multiplexers.

Alternatively, embodiment 40 in FIG. 5 may be modified by replacing section 41 with the cascade connection of seven 1-module sections (i.e. comprising one unit delay element 28), wherein the multiplexers 24 of each 1-module section receive at the two data inputs the output of flip-flop 28 in its own section and the output of the multiplexer 24 of the preceding section. This provides for reducing fanout to a maximum of two and for increasing operating frequency for a given number of components.

FIG. 6 shows a delay unit 44 featuring three 4-module delay sections 45 (with four unit delay elements 28) and a delay section 46 programmable from 0 to 3 and presenting three unit delay elements 28 and three multiplexers 24 connected as described with reference to FIG. 5. In this case also, the multiplexers 24 of sections 45, 46 receive selection signals $S_0$–$S_5$ which no longer correspond to the bits of digital delay control signal M, so that decoding logic is required.

Delay unit 44 requires 15 unit delay elements 28 and six multiplexers 24, with a maximum fanout of four.

A different embodiment of delay unit 44 comprises the cascade connection of three 4-module delay sections 45 and three unit delay sections as described above with reference to the alternative embodiment of unit 40 in FIG. 5. This solution provides for reducing fanout to a maximum of two for a given number of components and with a highly simple structure.

FIG. 7 shows a delay unit 50 formed by the cascade connection of seven 2-module delay sections 51 (with two unit delay elements 28) and a 1-module delay section 52. The multiplexers 24 of sections 51, 52 receive selection signals $S_0$-$S_7$ not corresponding to the bits of delay control signal M, so that, in this case also, decoding is required.

This solution requires eight multiplexers 24, and presents a maximum fanout of two. To prevent delaying input signal IN by propagating through a large number of multiplexers when no delay is programmed, provision should be made for a general bypass line and a further multiplexer controlled by an AND gate and connected downstream from section 52 as in the FIG. 3 embodiment (components 30-32).

Clearly, changes may be made to the programmable delay unit as described and illustrated herein without however, departing from the scope of the present invention. In particular, instead of decreasing as shown, the progression of the number of delay elements in successive delay blocks may increase or be presented in any order. Accordingly, the scope of the present invention is not limited to the foregoing specification, but instead is given by the appended claims along with their full range of equivalents.

We claim:

1. A programmable digital delay unit comprising:
   a plurality of delay blocks, each delay block having an input and an output, and including at least one delay element, each delay block operable to delay a digital input for a selected period of time;
   a plurality of multiplexers each connected to a corresponding one of the delay blocks, each multiplexer having first and second inputs respectively connected to the input and the output of the corresponding delay block, and an output connected to the input of a next delay block among the plurality of delay blocks; and
   means for disabling the at least one delay element of one delay block among the plurality of delay blocks to reduce power consumption.

2. The delay unit according to claim 1 wherein each delay element has a clock input for receiving a clock signal and wherein the means for disabling includes an AND gate for each delay block, each AND gate having a first input for receiving the clock signal, a second input for receiving a selection signal, and an output connected to the clock input of the at least one delay element of one delay block among the plurality of delay blocks.

3. A programmable digital delay unit comprising:
   a plurality of delay blocks with each delay block including at least one delay element, each delay block having an input and an output, and being operable to delay a digital input for a selected period of time;
   a plurality of multiplexers each connected to a corresponding delay block among the plurality of delay blocks, each multiplexer having first and second inputs respectively connected to the input and the output of the corresponding delay block, the multiplexer having an output connected to the input of a next delay block among the plurality of delay blocks, each multiplexer selecting either the input or the output of the corresponding delay block as the input to the next delay block; and
   a delay element disable circuit connected to an input of the at least one delay element of one delay block among the plurality of delay blocks, the delay element disable circuit disabling the at least one delay element to reduce power consumption when the multiplexer corresponding to the one delay block connects the input of the one delay block to the input of the next delay block.

4. The delay unit according to claim 3 wherein the at least one delay element has a clock input connected to the delay element disable circuit.

5. The delay unit according to claim 3 wherein the delay element disable circuit is connected to each delay element in each delay block.

6. A programmable digital delay unit comprising:
   a first delay block having an input and an output, and including at least one delay element;
   a first multiplexer having first and second inputs respectively connected to the input and the output of the first delay block to selectively bypass the first delay block;
   a second delay block including at least one delay element, the second delay block having an input connected to the output of the first multiplexer and an output; and
   a second multiplexer having first and second inputs respectively connected to the input and the output of the second delay block to selectively bypass the second delay block; and
   means for disabling at least one delay block of the first and second delay blocks to reduce power consumption when the at least one delay block is being bypassed.

7. A programmable digital delay unit comprising:
   a plurality of delay blocks, each delay block having an input and an output, and including at least one delay element, each delay block operable to delay a digital input for a selected period of time;
   a plurality of multiplexers each connected to a corresponding one of the delay blocks, each multiplexer having first and second inputs respectively connected to the input and the output of the corresponding delay block, the multiplexer having an output connected to the input of a next delay block among the plurality of delay blocks; and
   means for disabling the at least one delay element of one delay block among the plurality of delay blocks to reduce power consumption.

8. A programmable digital delay unit comprising:
   a plurality of delay blocks, each delay block having an input and an output, and including at least one delay element, each delay block operable to delay a digital input for a selected period of time;
   a plurality of multiplexers each connected to a corresponding one of the delay blocks, each multiplexer having first and second inputs respectively connected to the input and the output of the corresponding delay block, the multiplexer having an output connected to the input of a next delay block among the plurality of delay blocks; and
   means, connected to a clock input of the at least one delay element of one delay block among the plurality of delay blocks, for isolating a clock signal from the clock input of the at least one delay element to reduce power consumption.

9. A programmable digital delay unit comprising:
   a number of delay blocks, each presenting an input and an output;
   a number of controlled bypass elements, one for each delay block; each bypass element being connected to the input and to the output of the respective delay block for selectively connecting said input or said output of the respective delay block to the input of the next delay block;
   each said bypass element including a bypass line and a controlled switching element; each said bypass line being connected to the input of a respective delay block; and each switching element presenting two inputs connected respectively to the output of the respective delay block and to the respective bypass line, and an output connected to the input of the next delay block; and said delay unit having an input and an output, and further including general bypass means connected between said input and said output of said delay unit.

10. A delay unit as claimed in claim 9 wherein said general bypass means comprise a two-data-input switch having a first data input connected to said input of said delay unit, a second data input connected to the output of said delay unit, and a selection input connected to the output of a logic gate supplied with selection signals of said controlled switching elements.

11. A delay unit as claimed in claim 10 wherein said switching elements each present a selection input supplied with a selection signal, and each delay block includes at least one unit delay element having a clock input, further comprising delay block disabling means, including logic gates supplied with said selection signals for said switching elements and a clock signal, and in turn generating enabling signals supplied to said clock inputs of said unit delay elements.

12. A programmable digital delay unit comprising:

a number of delay blocks, each presenting an input and an output;

a number of controlled bypass elements, one for each delay block; each bypass element being connected to the input and to the output of the respective delay block for selectively connecting said input or said output of the respective delay block to the input of the next delay block;

each said bypass element including a bypass line and a controlled switching element; each said bypass line being connected to the input of a respective delay block; and each switching element presenting two inputs connected respectively to the output of the respective delay block and to the respective bypass line, and an output connected to the input of the next delay block; and delay block disabling means connected to at least one of the delay blocks.

\* \* \* \* \*